United States Patent
Maeda et al.

(10) Patent No.: US 10,338,234 B2
(45) Date of Patent: Jul. 2, 2019

(54) RADIOGRAPHIC IMAGE CAPTURING DEVICE

(71) Applicant: KONICA MINOLTA, INC., Chiyoda-ku (JP)

(72) Inventors: Kazuhiro Maeda, Hachioji (JP); Kenji Okajima, Kusatsu (JP); Tetsuo Nishi, Hachioji (JP); Yasuhito Kuwahara, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/802,815

(22) Filed: Nov. 3, 2017

(65) Prior Publication Data

US 2018/0143331 A1  May 24, 2018

(30) Foreign Application Priority Data

Nov. 24, 2016 (JP) .................................. 2016-227637

(51) Int. Cl.
*G01T 1/20* (2006.01)
*G01T 1/24* (2006.01)
*H01L 27/146* (2006.01)

(52) U.S. Cl.
CPC .............. *G01T 1/2018* (2013.01); *G01T 1/24* (2013.01); *G01T 1/241* (2013.01); *H01L 27/14632* (2013.01)

(58) Field of Classification Search
CPC ......... G01T 1/2018; G01T 1/24; G01T 1/241; H01L 27/14632
See application file for complete search history.

(56) References Cited

U.S. PATENT DOCUMENTS

| | | | | |
|---|---|---|---|---|
| 5,430,298 | A | * 7/1995 | Possin | G01T 1/2018 250/366 |
| 2011/0180889 | A1 | * 7/2011 | Jung | H01L 27/14663 257/428 |
| 2012/0248318 | A1 | * 10/2012 | Ito | G01T 1/24 250/361 R |
| 2013/0221230 | A1 | * 8/2013 | Tredwell | G01T 1/20 250/366 |
| 2015/0108358 | A1 | * 4/2015 | Sasaki | H01L 31/02327 250/370.11 |

FOREIGN PATENT DOCUMENTS

JP    2007-329434    12/2007

* cited by examiner

*Primary Examiner* — Christine S. Kim
(74) *Attorney, Agent, or Firm* — Cozen O'Connor

(57) ABSTRACT

A radiographic image capturing device includes: a sensor substrate having one surface on which a plurality of light-receiving elements are two-dimensionally arranged; and a scintillator substrate that is arranged on the side of the light-receiving elements of the sensor substrate, wherein a region having no interface between insulating layers that differ in refractive index is formed between the scintillator substrate and incident planes of the light-receiving elements of the sensor substrate.

8 Claims, 12 Drawing Sheets

RADIOGRAPHIC IMAGE CAPTURING DEVICE

Japanese Patent Application No. 2016-227637 filed on Nov. 24, 2016, including description, claims, drawings, and abstract the entire disclosure is incorporated herein by reference in its entirety.

BACKGROUND

Technological Field

The present invention relates to a radiographic image capturing device, and in particular, to a radiographic image capturing device that converts an irradiated radiation into image data to read the image data.

Description of the Related Art

There have been developed various kinds of radiographic image capturing devices, each of which converts a radiation such as irradiated X-rays into light having a different wavelength such as visible light by a scintillator, and then generates an electrical charge according to energy of the converted and irradiated light by a radiation detection element such as a photodiode to convert the electrical charge into image data.

This type of radiographic image capturing device is known as a FPD (Flat Panel Detector), and is conventionally configured as, what is called, a dedicated machine type radiographic image capturing device that is formed integrally with a support stand. However, in recent years, a transportable radiographic image capturing device that stores a radiation detection element and the like in a housing to enable transportability has been developed, and put to practical use.

In such a radiographic image capturing device, photoelectric conversion elements, each of which converts a radiation into an electrical charge, are arrayed in a matrix form, and a radiographic image is formed on the basis of an electrical charge detected by each photoelectric conversion element. However, in order to obtain a radiographic image with higher precision, it is necessary to attempt an improvement in detection sensitivity of each photoelectric conversion element.

Therefore, the radiographic image capturing device in the prior art forms a gap above an upper electrode formed on an upper part of a semiconductor layer to attempt an improvement in sensitivity (for example, refer to JP 2007-329434 A).

In general, a radiographic image capturing device includes a large number of insulating layers that are layered on an optical path formed after incident light enters until the incident light reaches a light receiving surface of a photoelectric conversion element, and an interface between the insulating layers attenuates a light beam passing therethrough due to a difference in refractive index between the insulating layers.

However, the above-described radiation generator in the prior art does not take into consideration the attenuation of the light beam, and thus is not capable of preventing a decrease in sensitivity caused by the attenuation occurring in the insulating layers.

SUMMARY

The present invention has been made taking the above-described problem into consideration, and an object of the present invention is to provide a radiographic image capturing device that is capable of improving the sensitivity of light-receiving elements.

To achieve the abovementioned object, according to an aspect of the present invention, a radiographic image capturing device reflecting one aspect of the present invention comprises:

a sensor substrate having one surface on which a plurality of light-receiving elements are two-dimensionally arranged; and a scintillator substrate that is arranged on the side of the light-receiving elements of the sensor substrate, wherein a region having no interface between insulating layers that differ in refractive index is formed between the scintillator substrate and incident planes of the light-receiving elements of the sensor substrate.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

15B is a cross-sectional view in which a boundary part between a scintillator substrate and a sensor substrate is enlarged.

DETAILED DESCRIPTION OF EMBODIMENTS

Hereinafter, one or more embodiments of a radiographic image capturing device according to the present invention will be described with reference to the drawings. However, the scope of the invention is not limited to the disclosed embodiments.

It should be noted that although the embodiments below each describe a transportable (also called, for example, cassette type) radiographic image capturing device in which photodiodes, each of which is a light-receiving element for detecting a radiation, are stored in a housing, the present invention can also be applied to a specialized machine type (also called, for example, fixed type) radiographic image capturing device that is formed integrally with a support stand.

First Embodiment

Schematic Configuration of Radiographic Image Capturing Device

Figure 1:
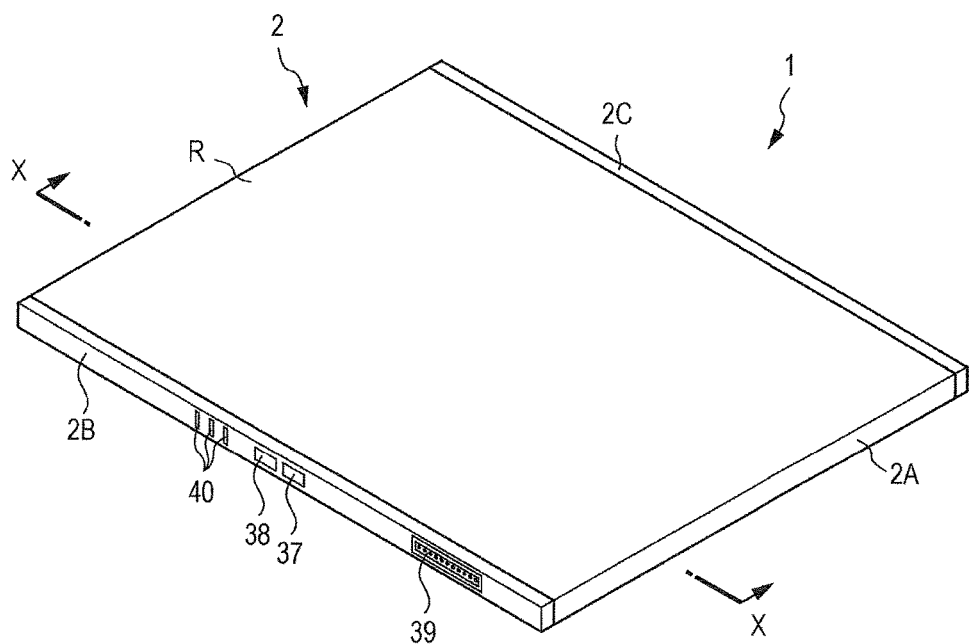
FIG. 1 is a perspective view illustrating an external appearance of a radiographic image capturing device.

First of all, a schematic configuration of a radiographic image capturing device 1 according to the present embodiment will be described below. FIG. 1 is a perspective view illustrating an external appearance of a radiographic image capturing device according to the present embodiment; and FIG. 2 is a cross-sectional view along an X-X line of FIG. 1.

Incidentally, the description below will be made on the basis of an up-and-down direction and a right-and-left direction in a state in which the radiographic image capturing device 1 is placed on a horizontal plane in such a manner that a radiation incident plane R faces the upper side as shown in FIG. 1. In addition, the relative size, length and the like of each member of the radiographic image capturing device 1 in each figure described below do not necessarily reflect a configuration of a real radiographic image capturing device.

Figure 2:
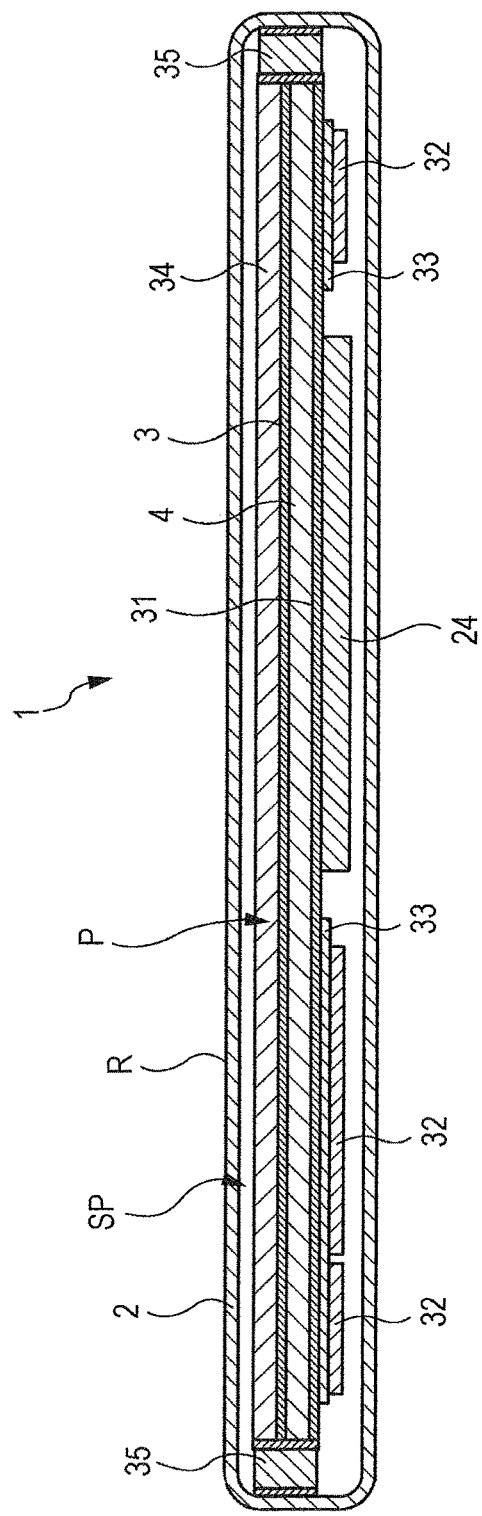
FIG. 2 is a cross-sectional view along an X-X line shown in FIG. 1.

As shown in FIGS. 1 and 2, the radiographic image capturing device 1 has a housing 2 for storing a sensor panel SP that is composed of a scintillator substrate 3, a sensor substrate 4 and the like.

In the present embodiment, the housing 2 is made of a material such as a carbon plate or a plastic, and has the radiation incident plane R through which a radiation passes.

In addition, a power switch 37, a selection switch 38, a connector 39, an indicator 40 and the like are arranged in a side wall part 2B on one side of the housing 2, the indicator 40 being composed of, for example, an LED that displays, for example, a battery state and an operating state of the radiographic image capturing device 1.

Moreover, although illustration is omitted, an antenna unit 41 (refer to FIG. 6 described below) is provided, for example, inside a side wall part 2C on the opposite side of the housing 2. In the present embodiment, this antenna unit 41 is configured to function as a communication unit in a case where a signal or the like is wirelessly transmitted and received between the radiographic image capturing device 1 and an external device.

As shown in FIG. 2, a base 31 is arranged inside the housing 2, and a sensor substrate 4 is provided on the radiation incident plane R side of the base 31 through a lead thin plate or the like (not illustrated). In addition, the scintillator substrate 3 is arranged on the radiation incident plane R side of the sensor substrate 4. The scintillator substrate 3 is provided with: a phosphor as a scintillator that converts an irradiated radiation into light such as visible light; an underlying substrate 34 provided with the phosphor.

In addition, the scintillator substrate 3 and the sensor substrate 4 are bonded together with the phosphor of the scintillator substrate 3 facing the sensor substrate 4 side. Incidentally, points of detail including a layered structure of the sensor substrate 4 will be described in detail later.

In addition, a PCB substrate 33 on which an electronic component 32 and the like are arranged, a battery 24 and the like are mounted on the opposite surface side of the base 31. In such a manner, the sensor panel SP is formed of the base 31, the sensor substrate 4 and like. Moreover, in the present embodiment, a cushioning material 35 is provided between the sensor panel SP and the side surface of the housing 2.

In the present embodiment, the scintillator substrate 3 is adapted to be disposed at a position that faces the undermentioned pixel region Ra (refer to FIG. 3 described below) of the sensor substrate 4. In the present embodiment, a scintillator that is primarily composed of, for example, a phosphor, and that when a radiation is incident, converts the incident radiation into an electromagnetic wave having a wavelength of 300 to 800 nm, that is to say, light around visible light, to output the light, is used as the scintillator of the scintillator substrate 3.

Figure 3:
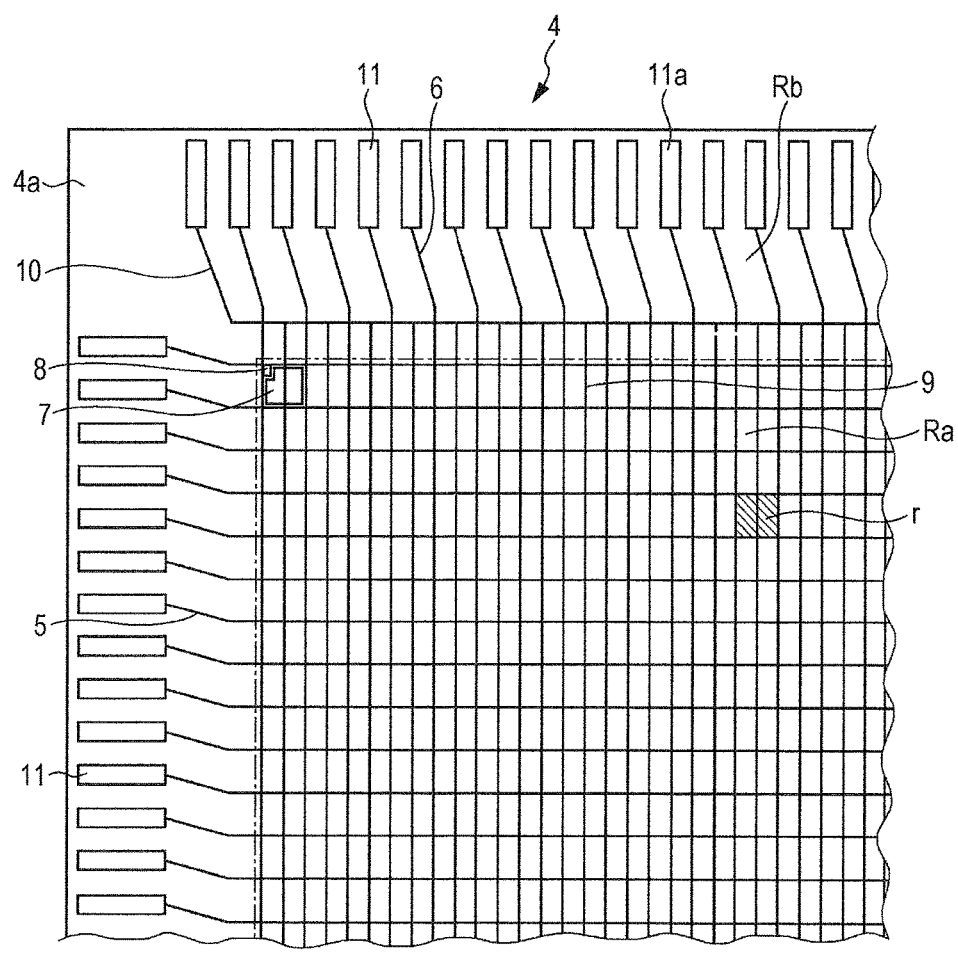
FIG. 3 is a plan view illustrating a configuration of a sensor substrate of the radiographic image capturing device.

In addition, in the present embodiment, the sensor substrate 4 is formed of a glass substrate, and a plurality of scanning lines 5 and a plurality of signal lines 6 are arranged on a surface 4a (hereinafter referred to as surface) of the side facing the scintillator substrate 3 (refer to FIG. 2) of the sensor substrate 4 in such a manner that each of the scanning lines 5 and each of the signal lines 6 intersect with each other as shown in FIG. 3. Moreover, photodiodes 7, each of which is a light-receiving element for detecting a radiation, are provided in respective subregions r partitioned by the plurality of scanning lines 5 and the plurality of signal lines 6.

Further, as described above, among areas on the surface 4a of the sensor substrate 4, areas that are formed two dimensionally (in a matrix form) by arranging the plurality of photodiodes 7 on the sensor substrate 4 (that is to say, areas surrounded by a dash-dot line in FIG. 3) constitute the pixel region Ra, and areas other than the pixel region Ra on the sensor substrate 4, around the pixel region Ra (in other words, in FIG. 3, areas outside the dash-dot lines), constitute a peripheral area Rb.

Figure 4:
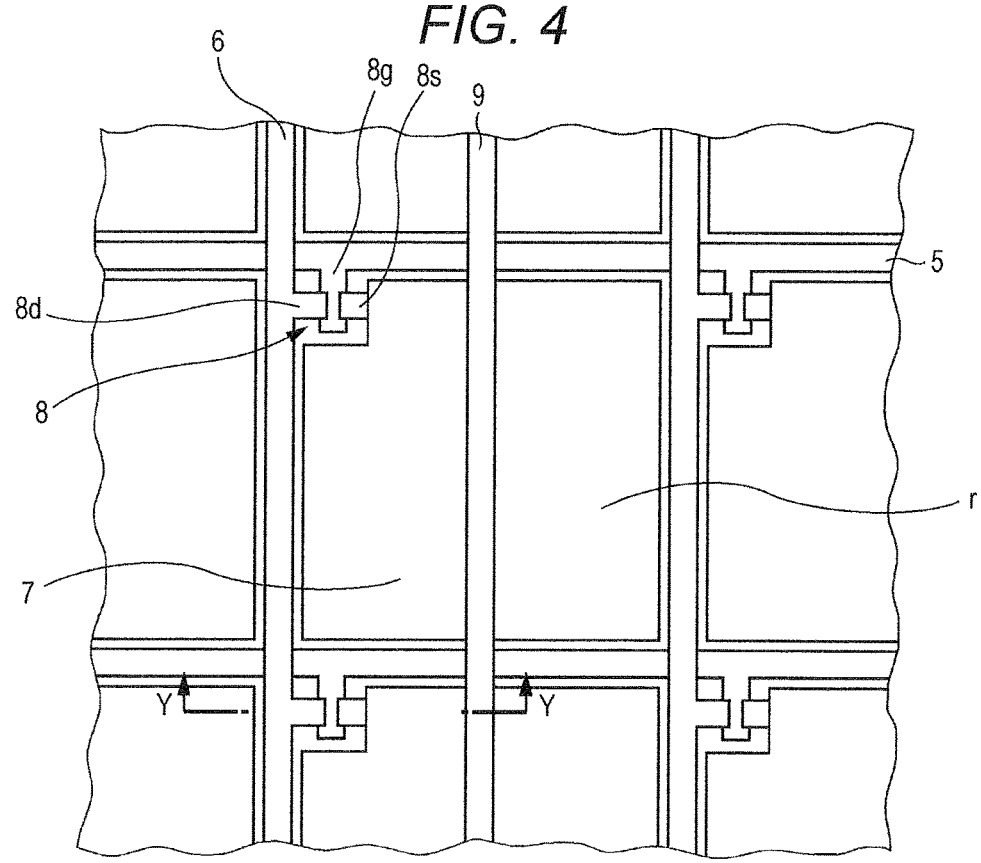
FIG. 4 is an enlarged view illustrating a configuration composed of a radiation detection element, a TFT and the like that are formed in a subregion on the sensor substrate shown in FIG. 3.

In the present embodiment, the photodiodes 7 are used as light-receiving elements. However, other than the photodiodes 7, for example, photo transistors or the like can also be used. As shown in FIG. 3, and FIG. 4 that is an enlarged view thereof, each of the photodiodes 7 is connected to a source electrode 8s of a TFT 8 that is a switching element. In addition, a drain electrode 8d of the TFT 8 is connected to the signal line 6.

When a radiation is incident from the radiation incident plane R of the housing 2 of the radiographic image capturing device 1, the scintillator substrate 3 converts the radiation into light such as visible light, and the photodiodes 7 are then irradiated with the converted light. As the result, the photodiodes 7 each generate an electron hole pair therein. The photodiodes 7 are each configured to convert the irradiated visible light into an electrical charge in this manner.

Subsequently, when an ON voltage is applied from a gate driver 15b (refer to FIG. 6 described below) of the undermentioned scan driving unit 15 to a gate electrode 8g through a scanning line 5, the TFT 8 is brought into an ON state. Consequently, the electrical charge accumulated in the photodiode 7 is emitted to the signal line 6 through the source electrode 8s and the drain electrode 8d. In addition, when an OFF voltage is applied to the gate electrode 8g through the scanning line 5, the TFT 8 is brought into an OFF state, and consequently the emission of the electrical charge from the photodiode 7 to the signal line 6 is stopped, which causes the electrical charge to be accumulated in the photodiode 7.

Moreover, in the present embodiment, as shown in FIGS. 3 and 4, one bias line 9 is connected to the plurality of photodiodes 7 that are arranged in a row. Furthermore, as shown in FIG. 3, each bias line 9 is connected to a connection line 10 in a peripheral area Rb of the sensor substrate 4.

Meanwhile, in the present embodiment, as shown in FIG. 3, each of the scanning lines 5, each of the signal lines 6, and the connection line 10 of the bias line 9 are connected to input/output terminals 11 (also called pads or the like) that are provided in the vicinity of the end edge of the sensor substrate 4.

Figure 5:
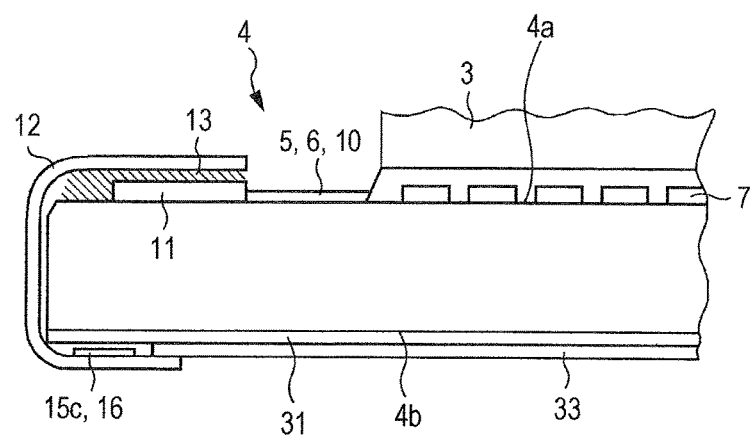
FIG. 5 is a side view illustrating a sensor substrate on which a flexible circuit substrate, a PCB substrate and the like are mounted.

As shown in FIG. 5, a flexible circuit substrate 12 (also called Chip On Film, etc.) in which chips such as the undermentioned read IC 16, and a gate IC 15c that forms a gate driver 15b of the scan driving unit 15 are built on a film is connected to each of the input/output terminals 11 through an anisotropic conductive adhesive material 13 such as an anisotropic conductive adhesive film (Anisotropic Conductive Film) and an anisotropic conductive paste (Anisotropic Conductive Paste).

In addition, the flexible circuit substrate 12 is adapted to be put around the back surface 4b side of the sensor substrate 4, and then to be connected to the above-described PCB substrate 33 on the back surface 4b side. The sensor panel SP of the radiographic image capturing device 1 is formed in this manner.

Figure 6:
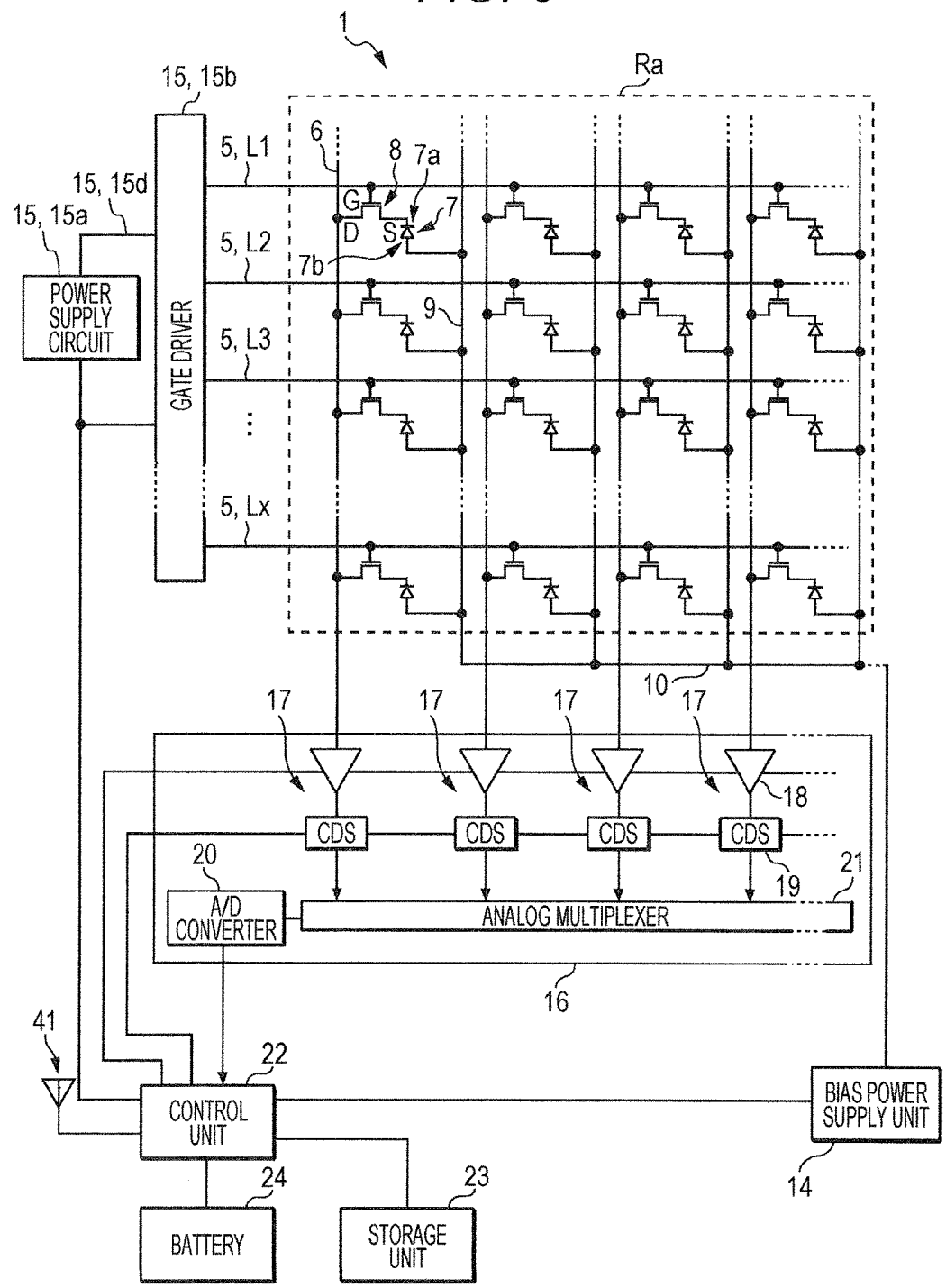
FIG. 6 is a block diagram illustrating an equivalent circuit of the radiographic image capturing device.
Figure 7:
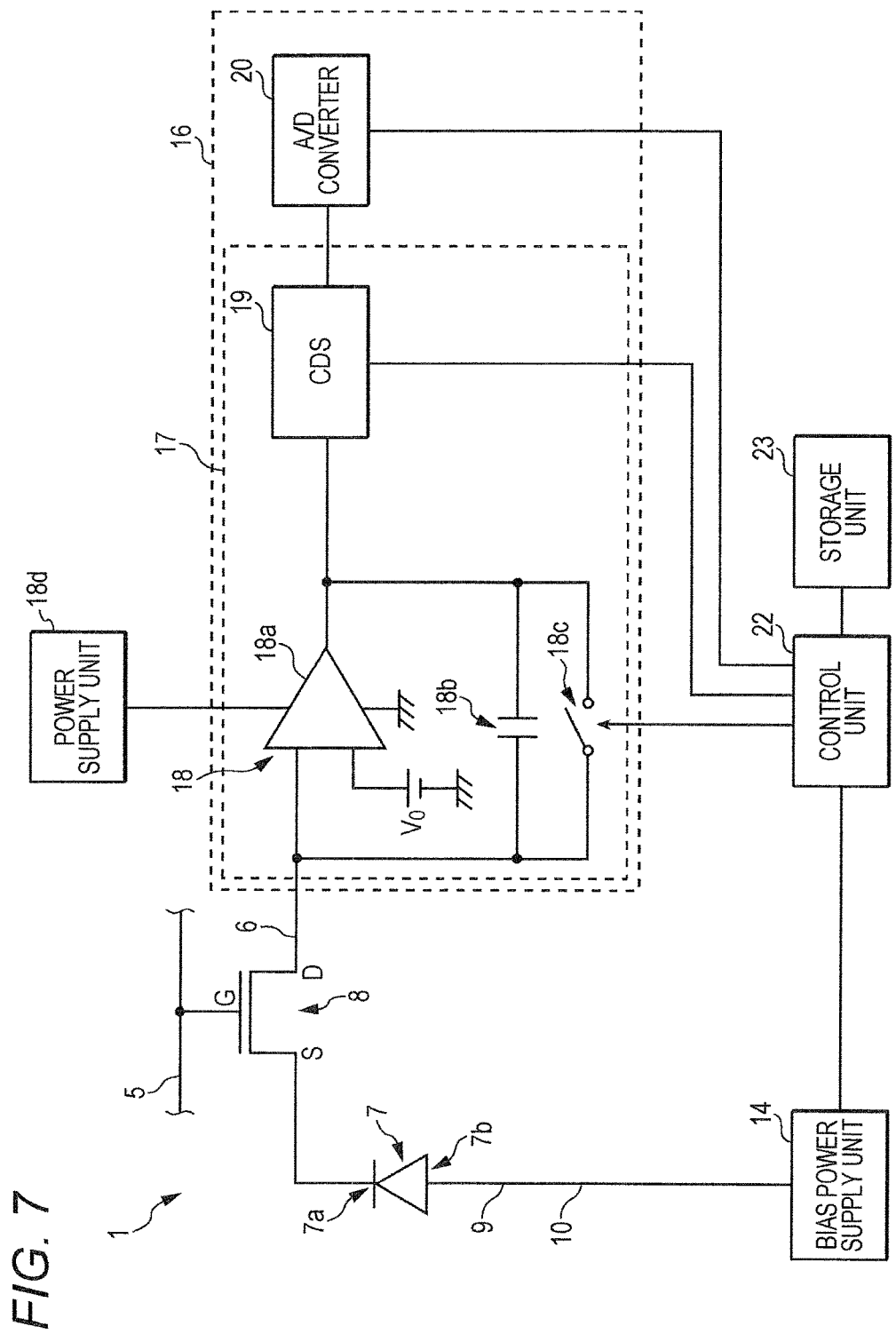
FIG. 7 is a block diagram illustrating an equivalent circuit corresponding to one pixel that constitutes a pixel region.

Here, a circuit configuration of the radiographic image capturing device 1 will be described. FIG. 6 is a block diagram illustrating an equivalent circuit of the radiographic image capturing device 1 according to the present embodiment; and FIG. 7 is a block diagram illustrating an equivalent circuit corresponding to one pixel that constitutes the pixel region Ra.

As described above, the bias line 9 is connected to a first transparent electrode 75 (an electrode on the light receiving surface side) of each of the photodiodes 7 in the pixel region Ra of the sensor substrate 4, and the connection line 10 to which the bias lines 9 are connected is connected to a bias power supply unit 14. The bias power supply unit 14 applies a reverse bias voltage to the first transparent electrode 75 of each of the photodiodes 7 through the connection line 10 and each of the bias lines 9.

In addition, a lower electrode 74 (an electrode on the side reverse to the light receiving surface) of each photodiode 7 is connected to the signal line 6 through the source electrode 8s and the drain electrode 8d of the TFT 8. Moreover, the gate electrode 8g of the TFT 8 is connected to the scanning line 5.

The scan driving unit 15 is provided with: a power supply circuit 15a that supplies the gate driver 15b with an ON voltage and an OFF voltage through a wiring line 15d; and a gate driver 15b that switches a voltage to be applied to each of lines L1 to Lx of the scanning line 5 between an ON voltage and OFF voltage to switch each of the TFTs 8 between an ON state and an OFF state.

As shown in FIGS. 6 and 7, the signal lines 6 are connected to respective read circuits 17 that are built into the read IC 16. The read circuit 17 is composed of an amplifying circuit 18, a correlation double sampling circuit 19 and the like. The read IC 16 further includes therein an analogue multiplexer 21, and an A/D converter 20. It should be noted that in FIGS. 6 and 7, the correlation double sampling circuit 19 is designated as CDS. In addition, FIG. 7 omits the analogue multiplexer 21.

In the present embodiment, the amplifying circuit 18 is configured by a charge amplifier circuit that is provided with: an operational amplifier 18a to which a capacitor 18b and an electrical charge reset switch 18c are connected in parallel with each other; and a power supply unit 18d that supplies the operational amplifier 18a with electric power.

The signal line 6 is connected to an inverting input terminal on the input side of the operational amplifier 18a of the amplifying circuit 18, and a reference electric potential $V_0$ is applied to a non-inverting input terminal on the input side of the amplifying circuit 18. It should be noted that the reference electric potential $V_0$ is set at a proper value, and can be set at 0 [V] (that is to say, GND electric potential), or can also be set at electric potential other than 0 [V].

In the case of read processing of reading image data D from each of the photodiodes 7, an ON voltage is applied from the gate driver 15b of the scan driving unit 15 to the scanning line 5 with the electrical charge reset switch 18c of the amplifying circuit 18 kept in an OFF state, and when the electrical charge is emitted from each of the photodiodes 7 to the signal line 6 through each of the TFTs 8 that are in an ON state, the electrical charge is accumulated in the capacitor 18b of the amplifying circuit 18. Subsequently, a voltage value in response to the quantity of electric charge accumulated in the capacitor 18b of the amplifying circuit 18 is output from the output side of the operational amplifier 18a.

The correlation double sampling circuit (CDS) 19 holds a voltage value Vin that is output from the amplifying circuit 18 before the electrical charge flows out from each of the photodiodes 7, and holds a voltage value Vfi that is output from the amplifying circuit 18 after the electrical charge flowed out from each of the photodiodes 7 is accumulated in the capacitor 18b of the amplifying circuit 18 as described above. Subsequently, the correlation double sampling circuit 19 calculates a difference Vfi-Vin between those voltage values, and outputs the calculated difference Vfi-Vin to the downstream side as image data D of an analogue value.

The image data D of each of the photodiodes 7 output from the correlation double sampling circuit 19 is sequentially transmitted to the A/D converter 20 through the analogue multiplexer 21, and is sequentially converted into the image data D, which is digital values, by the A/D converter 20. The converted image data D is output to a storage unit 23, and is then sequentially stored therein.

In addition, while the scanning line 5 to which the ON voltage is applied from the gate driver 15b of the scan driving unit 15 is sequentially switched, the image data D is read from each of the photodiodes 7 as described above, and is then sequentially stored in the storage unit 23.

The control unit 22 is configured to include: a computer in which a CPU (Central Processing Unit), a ROM (Read Only Memory), a RAM (Random Access Memory), an input-output interface and the like, which are not illustrated, are connected to a bus; and a FPGA (Field Programmable Gate Array). The control unit 22 may be configured by a dedicated control circuit.

The control unit 22 is configured to control the operation of each member of the radiographic image capturing device 1. In addition, as shown in FIG. 6 and the like, the storage unit 23 is connected to the control unit 22. The storage unit 23 includes a SRAM (Static RAM) and a SDRAM (Synchronous DRAM).

In addition, the control unit 22 is configured to control the operation of each functional part of the radiographic image capturing device 1. For example, the control unit 22 controls the scan driving unit 15, the read circuit 17 and the like to perform read processing of reading the image data D as described above.

Moreover, in the present embodiment, the above-described antenna unit 41 is connected to the control unit 22. Furthermore, the battery 24 is connected to the control unit 22. The battery 24 supplies the electric power to members such as the scan driving unit 15, the read circuit 17, the storage unit 23, and the bias power supply unit 14.

[Cross Section Structure of Sensor Substrate]

Figure 8:
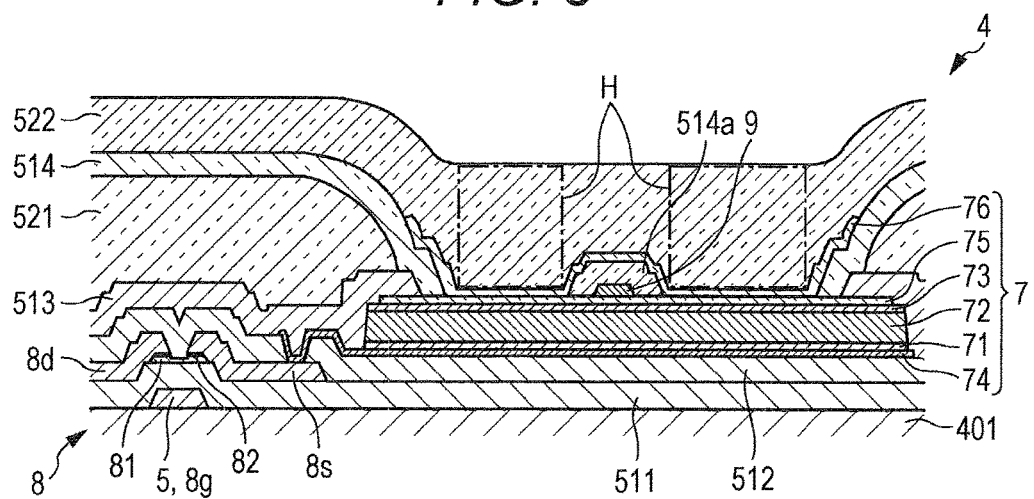
FIG. 8 is a cross-sectional view along a Y-Y line shown in FIG. 4.

FIG. 8 is a cross-sectional view along a Y-Y line shown in FIG. 4. A cross section structure of a part around the photodiode 7 in the sensor substrate 4 will be described with reference to FIG. 8.

FIG. 8 illustrates a structure between the sensor substrate 4 and the scintillator substrate 3. Although illustration is omitted in FIG. 8, the scintillator substrate 3 is provided in the upper part of the sensor substrate 4 in FIG. 8.

A first inorganic insulating layer 511 and a second inorganic insulating layer 512 are layered on the upper surface of the underlying substrate 401 of the sensor substrate 4 in order from the bottom. These inorganic insulating layers 511, 512, including the undermentioned third and fourth inorganic insulating layers 513, 514, are all formed of a nitride film such as silicon nitride ($SIN_x$), or an oxide film.

It should be noted that the whole upper surface of the underlying substrate 401 is formed with an inorganic insulating layer as a base beforehand, and the first and second inorganic insulating layer 511, 512 may be formed on the inorganic insulating layer.

In addition, the photodiode 7 is formed on the upper surface of the second inorganic insulating layer 512. This photodiode 7 has a structure in which an n layer 71 that is formed in an n-type by doping hydrogenated amorphous silicon, an organic photoelectric conversion material or the like with a group VI element, an i layer 72 that is a conversion layer formed of hydrogenated amorphous silicon, and a p layer 73 that is formed in a p-type by doping hydrogenated amorphous silicon with a group III element are layered in order from the bottom. It should be noted that the order of the formation of the n layer 71, the i layer 72 and the p layer 73 may be reversed.

In addition, the photodiode 7 has a lower electrode 74 that is formed on the upper surface of the second inorganic insulating layer 512, and the lower electrode 74 is connected to the source electrode 8s of the TFT 8 that is placed side by side with the photodiode 7.

Moreover, first and second transparent electrodes 75, 76 are layered on the upper surface of the n layer 71 in order from the bottom. These transparent electrodes 75, 76 are both formed of ITO (Indium Tin Oxide).

A bias line 9 as a wiring line for supplying the power to the photodiode 7 is formed between the above-described first and second transparent electrodes 75, 76, and a partial inorganic insulating layer 514a is formed between the bias line 9 and the second transparent electrode 76. The partial inorganic insulating layer 514a is formed concurrently with the fourth inorganic insulating layer 514 for the reason of the production process.

The third inorganic insulating layer 513 is formed on the upper surface of the second inorganic insulating layer 512 in such a manner to avoid a large part of the upper surface of the photodiode 7.

In other words, the third inorganic insulating layer 513 is formed in such a manner to cover only the upper surface of the second inorganic insulating layer 512 other than the photodiode 7, an outer peripheral part of the photodiode 7, and an outer edge part of the first transparent electrode 75 of the photodiode 7.

For example, the third inorganic insulating layer 513 covers the outer peripheral part of the photodiode 7 to perform protection at the time of the production process of the sensor substrate 4.

A first organic insulating layer 521 is layered on the upper surface of the third inorganic insulating layer 513 in a state in which the first organic insulating layer 521 is moved back in a direction further away from the photodiode 7 than an edge part of the third inorganic insulating layer 513. This first organic insulating layer 521 is formed of, for example, an organic material such as an acrylic resin, and is formed to reduce wiring line parasitic capacitance.

Further, the fourth inorganic insulating layer 514 is formed on the first organic insulating layer 521, and therefore the whole upper surface of the first organic insulating layer 521 is covered.

The fourth inorganic insulating layer 514 is also formed in such a manner to avoid a large part of the upper surface of the photodiode 7. However, the fourth inorganic insulating layer 514 is formed in such a manner to cover the edge part of the third inorganic insulating layer 513 in a state in which the fourth inorganic insulating layer 514 is extended toward the photodiode 7 side than the edge part of the third inorganic insulating layer 513.

Meanwhile, the outer edge part of the above-described second transparent electrode 76 is extended to the upper surface of the fourth inorganic insulating layer 514 that covers the outer edge part of the first transparent electrode 75. In addition, the fourth inorganic insulating layer 514 exists between the extended part of the second transparent electrode 76 and the first transparent electrode 75.

Moreover, a second organic insulating layer 522 is formed on the fourth inorganic insulating layer 514 and the second transparent electrode 76.

This second organic insulating layer 522 is an acrylic resin, and is formed to protect an inside configuration, and to planarize a surface in the pixel region Ra of the sensor substrate 4. In addition, this second organic insulating layer 522 is an outermost layer of the sensor substrate 4, and therefore is brought into direct contact with the lower surface of the scintillator substrate 3 (if the scintillator substrate 3 has a scintillator protective layer and a scintillator adhesion layer, the second organic insulating layer 522 is brought into contact with the scintillator protective layer and the scintillator adhesion layer). Therefore, the second organic insulating layer 522 also functions as a protective layer that protects a configuration around the photodiode 7 from chemical substances generated by the phosphor of the scintillator substrate 3.

The scintillator of the scintillator substrate 3 is formed of a columnar crystal of a phosphor. The phosphor is attached and fixed to the lower surface (the surface on the sensor substrate 4 side) of the underlying substrate 34 (refer to FIG. 2). It should be noted that the scintillator of the scintillator substrate 3 is not limited to a scintillator formed of a columnar crystal of a phosphor. Other types of scintillators, for example, a scintillator formed of a paste-like phosphor that is applied to the underlying substrate 34 or the like and is then hardened may be used.

In addition, the scintillator substrate 3 is stored in the housing 2 with the phosphor of the scintillator substrate 3 brought into direct contact with the upper surface of the second organic insulating layer 522.

Moreover, there is a case where the scintillator substrate 3 is provided with, on the lower side of the phosphor, a scintillator protective layer for protecting the outflow of chemical substances from the phosphor; and there is a case where the scintillator substrate 3 is further provided with, on the lower side of the scintillator protective layer, a scintillator adhesion layer for enhancing a degree of adhesion with the second organic insulating layer 522. In a case where the scintillator substrate 3 is provided with neither the scintillator protective layer nor the scintillator adhesion layer, the lower surface of the phosphor is brought into direct contact with the upper surface of the second organic insulating layer 522. In a case where the scintillator substrate 3 is provided with only the scintillator protective layer, the lower surface of the scintillator protective layer is brought into direct contact with the upper surface of the second organic insulating layer 522. In a case where the scintillator substrate 3 is provided with the scintillator protective layer and the scintillator adhesion layer, the lower surface of the scintillator adhesion layer is brought into direct contact with the upper surface of the second organic insulating layer 522.

Here, a characteristic configuration formed between the scintillator substrate 3 and the sensor substrate 4 will be further described.

The above-described sensor substrate 4 is characterized in that a region H having no interface between insulating layers that differ in refractive index is formed in a range from a position that is further on the sensor substrate 4 side than the lower surface of the scintillator substrate 3 (in a case where the lower surface of the phosphor of the scintillator substrate 3 is formed with a scintillator protective layer or a scintillator adhesion layer, or both of them, the lower surface of the scintillator substrate 3 is the lower surface of the lowest layer including these layers; hereinafter, the same applies unless otherwise noted) to the upper surface of the second transparent electrode 76 that is an incident plane of the photodiode 7.

In other words, as shown in FIG. 8, the region H having no interface between insulating layers that differ in refractive index is formed within a range that is on the upper surface of the photodiode 7, that is further inside than the fourth inorganic insulating layer 514, and that excludes the bias line 9 and the partial inorganic insulating layer 514a.

Within this range, only the second organic insulating layer 522 exists from the lower surface of the scintillator substrate 3 up to the upper surface of the second transparent electrode 76 of the photodiode 7. In other words, the region H having no interface between insulating layers that differ in refractive index is formed of a single insulating layer made of an organic material, that is to say, the region H is formed only of the second organic insulating layer 522. Only the single insulating layer exists, and therefore an interface between insulating layers that differ in refractive index does not exist.

In a case where an interface between insulating layers that differ in refractive index exists, a radiation that has been converted into visible light through the scintillator substrate 3 is attenuated by the interface before the radiation reaches the incident plane of the photodiode 7. Therefore, the detection sensitivity of the photodiode 7 decreases. However, the above-described sensor substrate 4 is provided with the region H having no interface between insulating layers that differ in refractive index, and therefore the attenuation of the radiation that has been converted into the visible light can be suppressed, which enables to attempt an improvement in detection sensitivity of the photodiode 7.

The fourth inorganic insulating layer 514 is formed on the whole upper surface of the photodiode 7 during the production process of the sensor substrate 4. However, the fourth inorganic insulating layer 514 is removed from the upper surface of the photodiode 7 in the middle of the production process.

Figure 9:
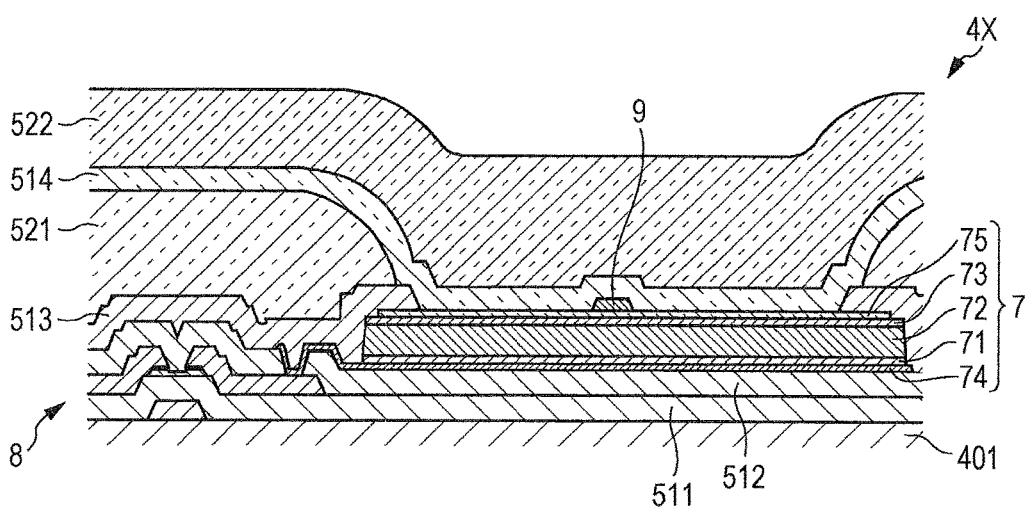
FIG. 9 is a cross-sectional view illustrating a layered structure of the sensor substrate that is a comparative example.

Here, FIG. 9 shows, as a comparative example, a cross section of a sensor substrate 4X on which the fourth inorganic insulating layer 514 is formed without being removed from the upper surface of the photodiode 7.

In a range from the lower surface of the scintillator substrate 3 to the upper surface of the photodiode 7 of the sensor substrate 4X, the fourth inorganic insulating layer 514 and the second organic insulating layer 522 are formed in two layers substantially all over the range, and thus the region H having no interface between insulating layers that differ in refractive index does not exist.

Therefore, in this sensor substrate 4X, the attenuation of the radiation that has been converted into visible light, which is caused by an interface between insulating layers that differ in refractive index, cannot be avoided. Accordingly, it is not possible to attempt an improvement in detection sensitivity of the photodiode 7.

Figure 10:
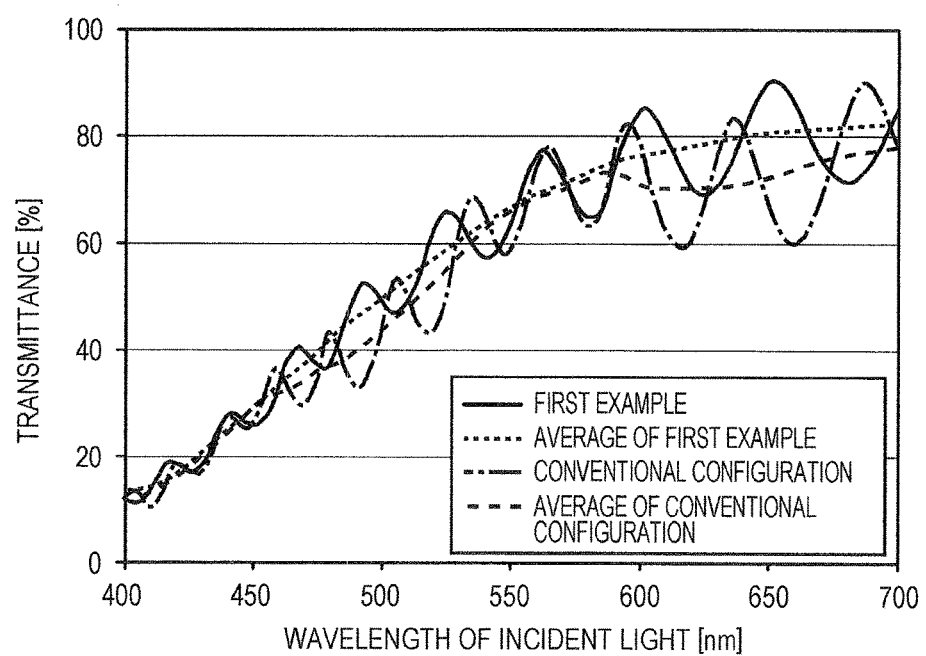
FIG. 10 is a chart illustrating a result of determining the transmittance of incident light at each wavelength by means of simulation in an example and in a comparative example.

FIG. 10 is a chart illustrating a result of determining the transmittance of incident light at each wavelength by means of simulation on the assumption that a first example is the sensor substrate 4, and a comparison configuration is the sensor substrate 4X. In addition, for reference, FIG. 10 also shows curves each indicating average values of transmittances that cyclically increase and decrease according to a change in wavelength.

Comparing the curves each indicating average values of transmittances, it is clearly shown that transmittances of the first example in which an interface between insulating layers that differ in refractive index is removed have been further improved.

It should be noted that the region H having no interface between insulating layers that differ in refractive index is not always required to exist over the whole incident plane of the photodiode 7. Even if the incident plane is partially provided with the region H having no interface between insulating layers that differ in refractive index, an effect of improving the transmittance of incident light, and an effect of improving the detection sensitivity, can be achieved.

[Production Process of Sensor Substrate]

Although a repeated description will not be made in a step of layering each layer below, proper processing of, for example, removing an unnecessary part by etching or the like is performed in the layering step. In other words, a step related to "layering step" and "forming by layering" described below includes required processing such as etching.

Figure 11A:
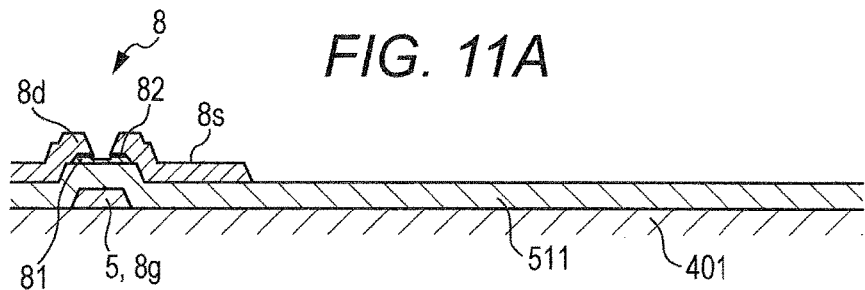
FIGS. 11A to 11D are cross-sectional views that show production processes of the sensor substrate in order.

In a process of manufacturing a layered structure of the sensor substrate 4, as shown in FIG. 11A, first of all, a scanning line 5 made of Al, Cr or the like is layered and formed on the surface of the underlying substrate 401 of the sensor substrate 4. This scanning line 5 is formed integrally with the gate electrode 8g of the TFT 8 at a position at which the TFT 8 is formed.

Moreover, the first inorganic insulating layer 511 is layered and formed on the scanning line 5 and on the upper surface of the underlying substrate 401. At a position of the TFT 8 in the first inorganic insulating layer 511, the source electrode 8s and the drain electrode 8d are layered and formed on the first inorganic insulating layer 511 through a semiconductor layer 81 and an ohmic contact layer 82. As the result, the TFT 8 is formed.

Figure 11B:
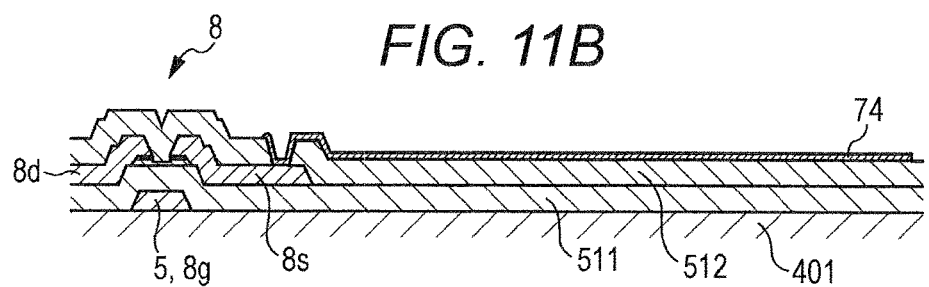

Subsequently, as shown in FIG. 11B, the second inorganic insulating layer 512 is layered and formed on the TFT 8 and on the first inorganic insulating layer 511. This second inorganic insulating layer 512 plays a role of separating the source electrode 8s and the drain electrode 8d of the TFT 8 from each other.

In addition, Al, Cr, Mo or the like are layered on the upper surface of the second inorganic insulating layer 512 to form the lower electrode 74 of the photodiode 7. This lower electrode 74 is connected to the source electrode 8s of the TFT 8 through a hole that penetrates the second inorganic insulating layer 512.

Figure 11C:
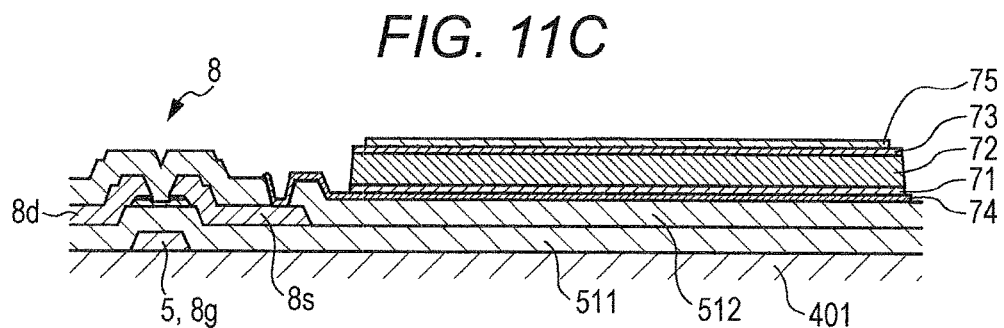

Subsequently, as shown in FIG. 11C, the n layer 71, the i layer 72 and the p layer 73 are layered and formed on the lower electrode 74 of the photodiode 7 in order from the bottom.

In addition, the first transparent electrode 75 of the photodiode 7, which is formed of a transparent electrode such as ITO (Indium Tin Oxide), is layered and formed on the p layer 73.

Figure 11D:
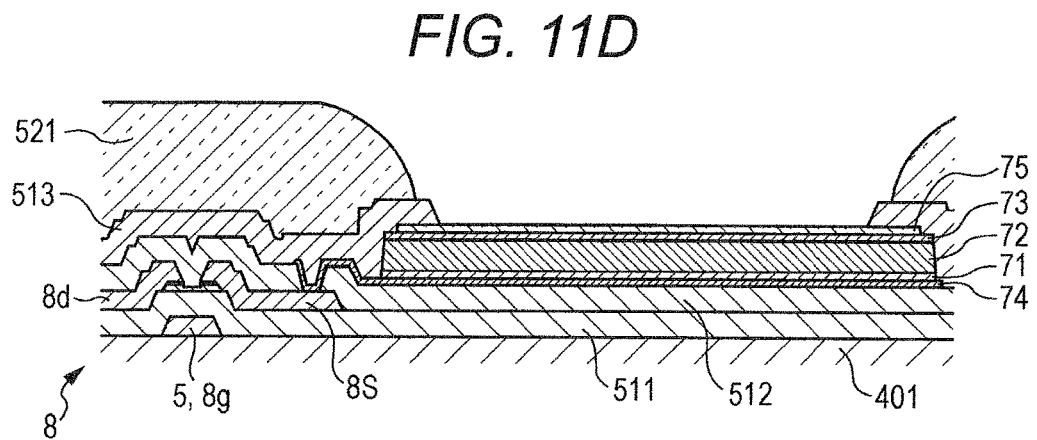

Subsequently, as shown in FIG. 11D, the third inorganic insulating layer 513 is layered and formed on the second inorganic insulating layer 512, on a side wall part of the photodiode 7 in which the second transparent electrode 76 is not yet formed, and on an outer edge part of the upper surface of the photodiode 7.

It should be noted that after the whole upper surface of the first transparent electrode 75 of the photodiode 7 is formed with the third inorganic insulating layer 513, the third inorganic insulating layer 513 may be removed from the whole upper surface excluding the outer edge part of the first transparent electrode 75.

Subsequently, the first organic insulating layer 521 is layered and formed on the third inorganic insulating layer 513. As shown in FIG. 11D, the first organic insulating layer 521 is formed backward to some extent in such a manner that the first organic insulating layer 521 does not protrude from the upper surface of the third inorganic insulating layer 513 toward the photodiode 7 side.

The third inorganic insulating layer 513 and the first organic insulating layer 521 are formed so as to avoid the incident plane of the photodiode 7, and therefore are exclusively formed above the TFT 8 or the like.

Figure 12A:
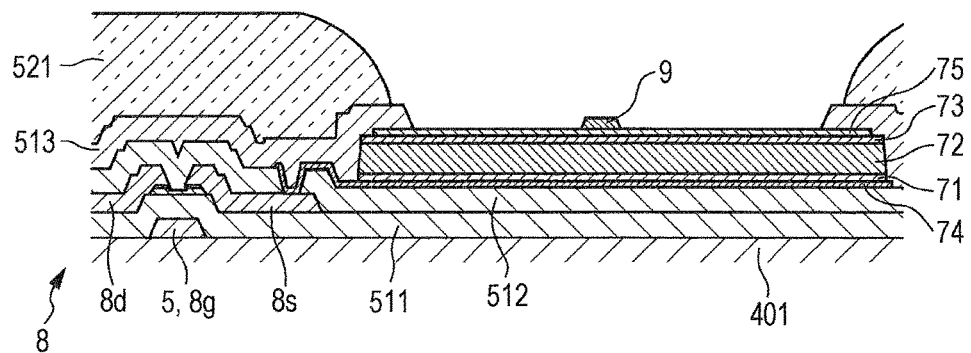
FIGS. 12A to 12C are cross-sectional views that show production processes of the sensor substrate in order continued from FIG. 11D.

In addition, as shown in FIG. 12A, Al or the like is layered on the first transparent electrode 75 of the photodiode 7 to form the bias line 9.

Figure 12B:
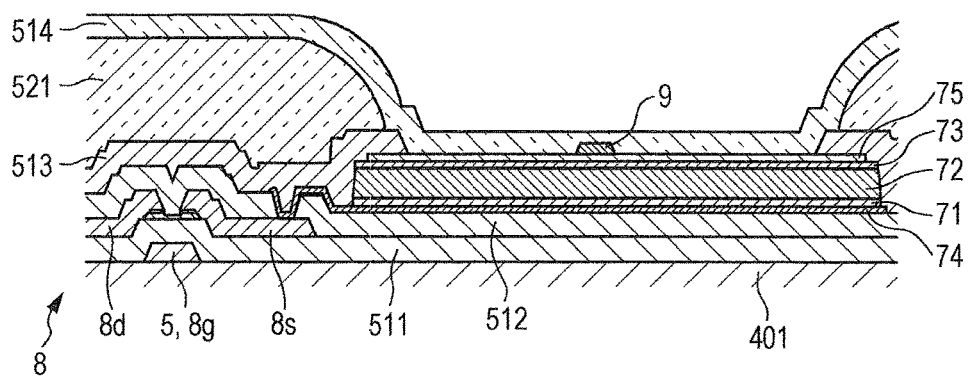

Moreover, as shown in FIG. 12B, the fourth inorganic insulating layer 514 is formed over the whole pixel region Ra of the sensor substrate 4.

Figure 12C:
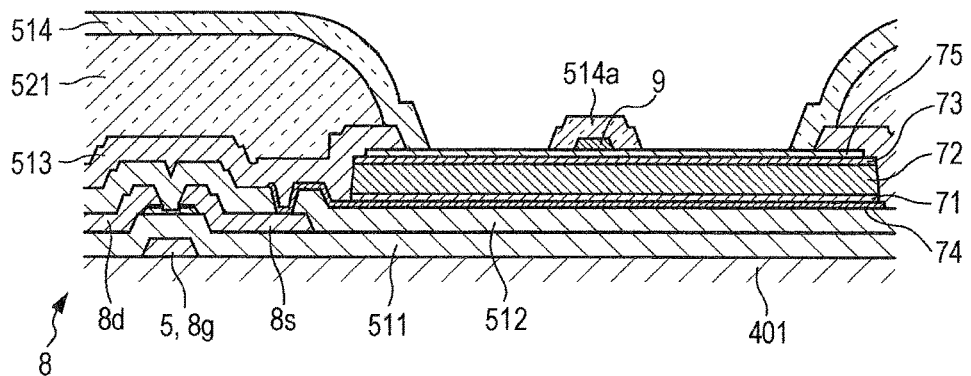

Further, as shown in FIG. 12C, the fourth inorganic insulating layer 514 is removed from the upper surface of the first transparent electrode 75 of the photodiode 7. In this case, the fourth inorganic insulating layer 514 is removed from the outer edge part of the first transparent electrode 75 formed on the upper surface of the photodiode 7, and from a part other than the periphery of the bias line 9, by a technique such as etching. When the fourth inorganic insulating layer 514 is removed by etching, the periphery of the bias line 9 is masked so as not to be removed together. This remaining part becomes the partial inorganic insulating layer 514a.

As the result, the outer edge part on the upper surface of the first transparent electrode 75 of the photodiode 7, and the part other than the periphery of the bias line 9 are brought into an exposed state.

Next, in order to form the second transparent electrode 76 and an electrode 11a of the input/output terminal 11 in the peripheral area Rb, ITO is layered over the whole range of the upper surface of the sensor substrate 4.

In addition, formation patterns of all of the electrodes 11a, an exposed part on the upper surface of the first transparent electrode 75 of the photodiode 7, the upper surface of the partial inorganic insulating layer 514a, and the edge part on the photodiode 7 side of the fourth inorganic insulating layer 514 are masked, and subsequently the ITO is etched in such a manner that the masked range remains.

As the result, as shown in FIG. 8, with respect to the ITO layer, a part exposed from the fourth inorganic insulating layer 514 on the upper surface of the first transparent electrode 75 of the photodiode 7, and a part that covers the outer edge part on the photodiode 7 side of the fourth inorganic insulating layer 514 and the partial inorganic insulating layer 514a remain as the second transparent electrode 76. In addition, in the peripheral area Rb, the ITO layer remains as the electrodes 11a of the input/output terminal 11.

Subsequently, as shown in FIG. 8, the second organic insulating layer 522 is layered and formed on the fourth inorganic insulating layer 514 and on the second transparent electrode 76, and the second organic insulating layer 522 is then planarized.

As the result, the sensor substrate 4 is completed. After that, the scintillator substrate 3 is placed on the sensor substrate 4 so as to bring the lower surface of the scintillator substrate 3 into contact with the upper surface of the second organic insulating layer 522, and is then stored in the housing 2.

Technical Effects of First Embodiment

The above-described radiographic image capturing device 1 is formed with the region H having no interface between insulating layers that differ in refractive index in a range from a position that is further on the sensor substrate 4 side than the sensor substrate 4 side surface of the scintillator substrate 3 to the upper surface of the second transparent electrode 76 as an incident plane of the photodiode 7.

In particular, the region H is formed of the second organic insulating layer 522 as a single insulating layer made of an acrylic resin that is an organic material.

Therefore, the attenuation of visible light that has passed through the scintillator substrate 3 can be suppressed in the region H, which enables to attempt an improvement in detection sensitivity of the photodiode 7. As the result, the radiographic image capturing device 1 is capable of obtaining a radiographic image with high precision.

In addition, the second organic insulating layer 522 is a planarization layer of the sensor substrate 4, and the region H having no interface between insulating layers that differ in refractive index can be formed from the planarization layer. Thus, two functions are realized by one second organic insulating layer 522. This enables to attempt the simplification of the layered structure, and consequently enables to achieve an improvement in productivity and an improvement in cost performance.

Incidentally, the region H having no interface between insulating layers that differ in refractive index is formed while avoiding the bias line 9 as a wiring line for supplying the power to the photodiode 7. However, basically, the position at which the bias line 9 is formed hinders the visible light from being incident on the incident plane of the photodiode 7, and therefore an influence exerted by forming the region H while avoiding the bias line 9 is very small.

Moreover, the first transparent electrode 75 is formed on the light incident plane of the photodiode 7, and the region H having no interface between insulating layers that differ in refractive index is formed inside a formation range of the first transparent electrode 75 viewing from a light incidence direction.

Therefore, the insulating layer (more specifically, the third and fourth inorganic insulating layers 513, 514) can be formed up to the outer edge part (the outer edge part of the region H) of the first transparent electrode 75, and the outer periphery of the photodiode 7 and the outer edge part of the upper surface of the photodiode 7 can be covered by the insulating layer. Therefore, the photodiode 7 can be protected by the insulating layer in the production process of the sensor substrate 4.

Further, the first transparent electrode 75 is formed on the light incident plane of the photodiode 7, and therefore the upper surface of the photodiode 7 can be protected by the first transparent electrode 75 in the production process of the sensor substrate 4.

Furthermore, the sensor substrate 4 is formed with the second transparent electrode 76 on the scintillator substrate 3 side of the first transparent electrode 75, and has the fourth inorganic insulating layer 514 that exists between the first transparent electrode 75 and the second transparent electrode 76.

Even after the formation of the first transparent electrode 75, various kinds of layers are layered on the sensor substrate 4, and the sensor substrate 4 is subjected to etching, through many production processes. However, this will cause the first transparent electrode 75 to deteriorate.

Therefore, by adopting a layered structure having the fourth inorganic insulating layer 514 that exists between the first transparent electrode 75 and the second transparent electrode 76, in the production process, after layering of the fourth inorganic insulating layer 514, the second transparent electrode 76 can be layered for repairing the first transparent electrode 75. Therefore, the influence exerted by the deterioration of the transparent electrode is eliminated, and consequently the detection of a radiation can be satisfactorily performed by the photodiode 7.

[Other Arrangements of Bias Lines]

The bias line 9 of the photodiode 7 can also be provided in a place other than the upper surface of the photodiode 7, for example, on the lower surface side of the photodiode 7.

Figure 13:
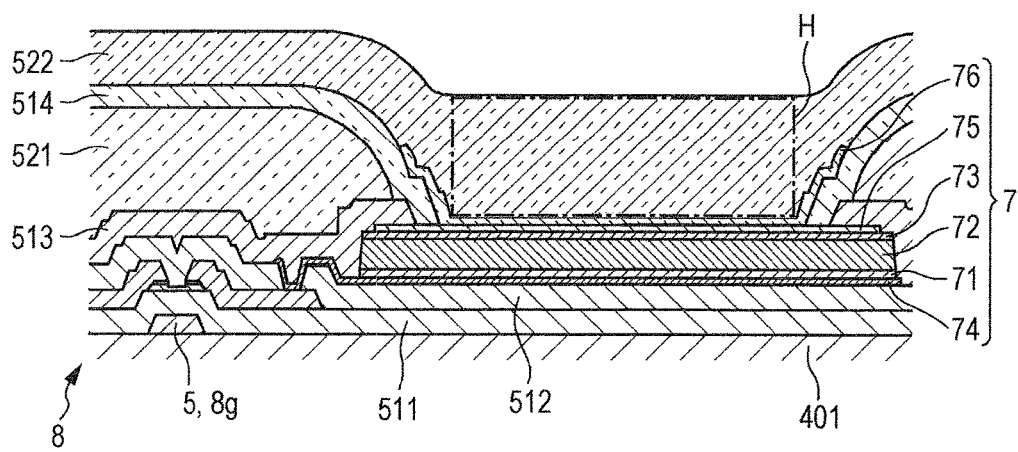
FIG. 13 is a cross-sectional view illustrating a layered structure of a sensor substrate obtained in a case where a bias line is not provided on the upper surface of a photodiode.

If the bias line 9 is provided in a place other than the upper surface of the photodiode 7 in this manner, as shown in FIG. 13 (illustration of the bias line 9 is omitted), the whole region that is inside the fourth inorganic insulating layer 514 on the upper surface of the second transparent electrode 76 can be configured to be the region H having no interface between insulating layers that differ in refractive index.

This enables to attempt a further improvement in detection sensitivity of the photodiode 7, and enables the radiographic image capturing device 1 to obtain a radiographic image with high precision.

Second Embodiment

A second embodiment of the present invention will be described with reference to the drawings. The second embodiment has the feature of a layered structure composed of a sensor substrate and a scintillator substrate. Points of difference between the first and second embodiments will be mainly described below. The same components as those of the first embodiment are denoted by the same reference numerals, and overlapping explanation will be omitted.

Figure 14A:
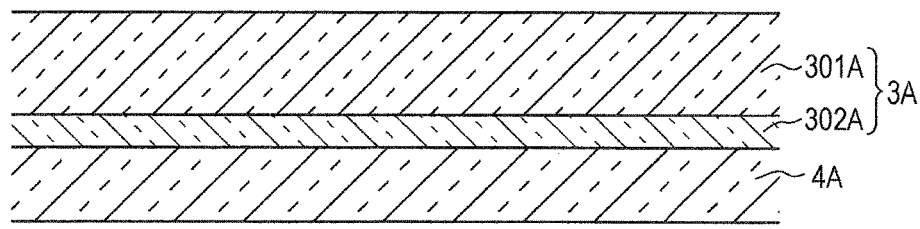
FIG. 14A is a cross-sectional view illustrating a layered structure of a sensor substrate on which a scintillator substrate is mounted according to a second embodiment.
Figure 14B:
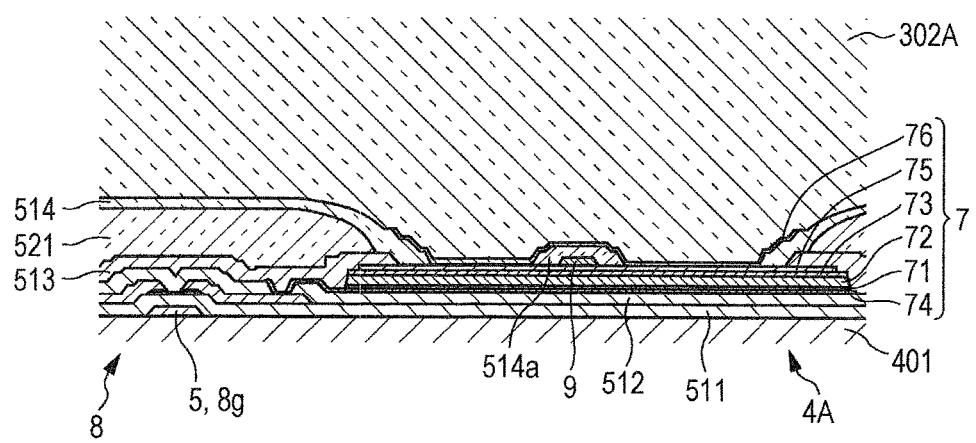
FIG. 14B is a cross-sectional view in which a boundary part between a scintillator substrate and a sensor substrate is enlarged.

FIG. 14A is a cross-sectional view illustrating a layered structure of a sensor substrate 4A on which a scintillator substrate 3A is placed, and FIG. 14B is a cross-sectional view in which a boundary part between the scintillator substrate 3A and the sensor substrate 4A is magnified.

As shown in FIG. 14A, the scintillator substrate 3A is provided with: a scintillator layer 301A that is provided with a phosphor on the lower surface of an underlying substrate; and a scintillator protective layer 302A that is formed on the lower surface side of the scintillator layer 301A, and that prevents the outflow of chemical substances from a phosphor toward the sensor substrate 4A side. This scintillator protective layer 302A is formed of, for example, parylene.

Meanwhile, the sensor substrate 4A has a configuration that excludes the second organic insulating layer 522 from the sensor substrate 4 described above. The scintillator substrate 3A is directly placed on the upper surface of the fourth inorganic insulating layer 514 and on the upper surface of the second transparent electrode 76. In other words, the lower surface of the scintillator protective layer 302A is brought into direct contact with the upper surface of the fourth inorganic insulating layer 514 and the upper surface of the second transparent electrode 76.

It should be noted that the work of bringing the lower surface of the scintillator protective layer 302A into contact with the upper surface of the fourth inorganic insulating layer 514 and the upper surface of the second transparent electrode 76 is performed under a strictly managed environment, as with the layer formation process or the like, so as not to cause chemical substances, water, dust, foreign matters and the like to get into a space between the fourth inorganic insulating layer 514 and the second transparent electrode 76.

In addition, a gap may be generated between the upper surface of the fourth inorganic insulating layer 514, or the upper surface of the second transparent electrode 76, and the lower surface of the scintillator protective layer 302A. However, an influence of the gap exerted on the detection sensitivity of the photodiode 7 is small.

In the case of such a configuration as well, a region having no interface between insulating layers that differ in refractive index is formed in a range from a position that is further on the sensor substrate 4A side than the sensor substrate 4A side surface (the lower surface of the scintillator protective layer 302A) of the scintillator substrate 3A to the upper surface of the second transparent electrode 76 as an incident plane of the photodiode 7. Therefore, a state in which no insulating layer exists, in other words, a state in which no interface between insulating layers that differ in refractive index exists, can be generated.

Therefore, the attenuation of visible light that has passed through the scintillator substrate 3A can be suppressed, which enables to attempt an improvement in detection sensitivity of the photodiode 7. As the result, the radiographic image capturing device 1 is capable of obtaining a radiographic image with high precision.

It should be noted that the above-described sensor substrate 4A may also be provided with the bias line 9 on the lower surface side of the photodiode 7 so as to extend the range within which no interface between insulating layers that differ in refractive index exists, enabling to attempt a further improvement in detection sensitivity of the photodiode 7.

Third Embodiment

A third embodiment of the present invention will be described with reference to the drawings. The third embodiment has the feature of a layered structure composed of a sensor substrate and a scintillator substrate. Points of difference between the third embodiment and the first or second embodiment will be mainly described below. The same components as those of the first and second embodiments are denoted by the same reference numerals, and overlapping explanation will be omitted.

Figure 15A:
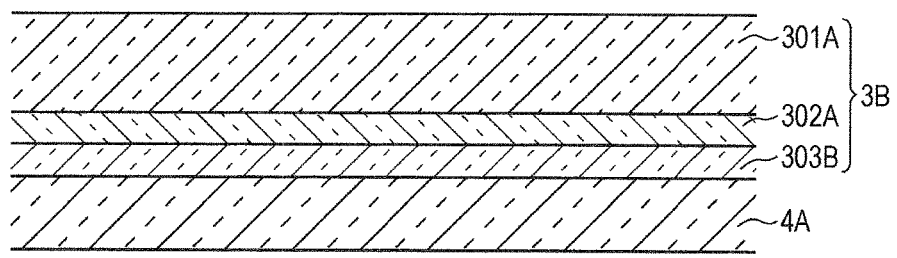
FIG. 15A is a cross-sectional view illustrating a layered structure of a sensor substrate on which a scintillator substrate is mounted according to a third embodiment, and FIG.
Figure 15B:
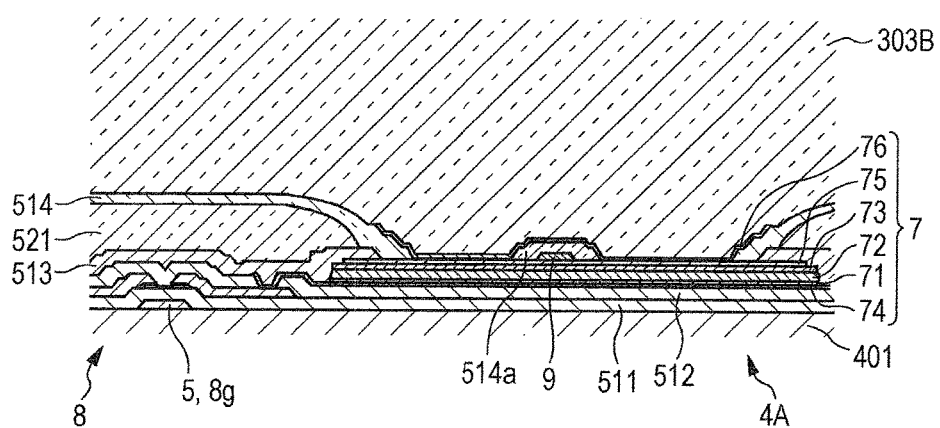

FIG. 15A is a cross-sectional view illustrating a layered structure of the sensor substrate 4A on which a scintillator substrate 3B is placed, and FIG. 15B is a cross-sectional view in which a boundary part between the scintillator substrate 3B and the sensor substrate 4A is magnified.

The scintillator protective layer 302A of the scintillator substrate 3A described above has low adhesiveness, and therefore this scintillator substrate 3B is provided with not only the scintillator layer 301A and the scintillator protective layer 302A, but also a scintillator adhesion layer 303B for increasing a degree of adhesion with the sensor substrate 4A, the scintillator adhesion layer 303B being provided on the lower surface side of the scintillator protective layer 302A. This scintillator adhesion layer 303B may a film having adhesiveness, or may be formed from a tape having adhesiveness.

In addition, the scintillator substrate 3B is directly placed on the upper surface of the fourth inorganic insulating layer 514 and on the upper surface of the second transparent electrode 76 in the sensor substrate 4A. In other words, the lower surface of the scintillator adhesion layer 303B is brought into direct contact with the upper surface of the fourth inorganic insulating layer 514 and the upper surface of the second transparent electrode 76.

It should be noted that the work of bringing the lower surface of the scintillator adhesion layer 303B into contact with the upper surface of the fourth inorganic insulating layer 514 and the upper surface of the second transparent electrode 76 is performed under a strictly managed environment, as with the layer formation process or the like, so as not to cause chemical substances, water, dust, foreign matters and the like to get into a space between the fourth inorganic insulating layer 514 and the second transparent electrode 76.

In addition, a gap may be generated between the upper surface of the fourth inorganic insulating layer 514, or the upper surface of the second transparent electrode 76, and the lower surface of the scintillator adhesion layer 303B, and between the lower surface of the scintillator protective layer 302A and the upper surface of the scintillator adhesion layer 303B. However, an influence exerted on the detection sensitivity of the photodiode 7 is small.

In the case of such a configuration as well, a region having no interface between insulating layers that differ in refractive index is formed in a range from a position that is further on the sensor substrate 4A side than the sensor substrate 4A side surface (the lower surface of the scintillator adhesion layer 303B) of the scintillator substrate 3B to the upper surface of the second transparent electrode 76 as an incident plane of the photodiode 7. Therefore, a state in which no insulating layer exists, in other words, a state in which no interface between insulating layers that differ in refractive index exists, can be generated.

Therefore, the attenuation of visible light that has passed through the scintillator substrate 3B can be suppressed, which enables to attempt an improvement in detection sensitivity of the photodiode 7. As the result, the radiographic image capturing device 1 is capable of obtaining a radiographic image with high precision.

It should be noted that the above-described sensor substrate 4A may also be provided with the bias line 9 on the lower surface side of the photodiode 7 so as to extend the range within which no interface between insulating layers that differ in refractive index exists, enabling to attempt a further improvement in detection sensitivity of the photodiode 7.

Although embodiments and modifications of the present invention have been described and illustrated in detail, it is clearly understood that the same is by way of illustration and example only and not limitation, the scope of the present invention should be interpreted by terms of the appended claims. It is needless to say that the present invention can be modified as appropriate without departing from the gist of the present invention.

What is claimed is:

1. A radiographic image capturing device comprising:
a sensor substrate having one surface on which a plurality of light-receiving elements are two-dimensionally arranged, wherein the sensor substrate includes an electrode that is an incident plane of the light-receiving elements;
a scintillator substrate that is arranged on a side of the light-receiving elements of the sensor substrate; and
an insulating layer, comprised of an organic material, having a given refractive index formed in a region between the scintillator substrate and the electrode that is the incident plane of the light-receiving elements of the sensor substrate,
wherein no insulating layer with a refractive index different from said given refractive index is formed in said region so that said region has no interface between insulating layers that differ in refractive index.

2. The radiographic image capturing device according to claim 1, wherein the insulating layer comprised of the organic material is a planarization layer of the sensor substrate.

3. The radiographic image capturing device according to claim 1, wherein the region having no interface between insulating layers that differ in refractive index is formed while avoiding a wiring line for supplying power to the light-receiving elements.

4. The radiographic image capturing device according to claim 1, wherein a first transparent electrode is formed on the light incident plane of the light-receiving element.

5. The radiographic image capturing device according to claim 4, wherein the region having no interface between insulating layers that differ in refractive index is inside a formation range of the first transparent electrode.

6. The radiographic image capturing device according to claim 4, wherein a second transparent electrode is formed on the scintillator substrate side of the first transparent electrode, and an insulating layer exists between the first transparent electrode and the second transparent electrode.

7. A radiographic image capturing device comprising:
a sensor substrate having one surface on which a plurality of light-receiving elements are two-dimensionally arranged; and a scintillator substrate that is arranged on a side of the light-receiving elements of the sensor substrate, wherein a region having no interface between insulating layers that differ in refractive index is formed between the scintillator substrate and an incident plane in each of the light-receiving elements of the sensor substrate, wherein the scintillator substrate has a scintillator layer and a scintillator protective layer, with the scintillator protective layer arranged between the scintillator layer and the sensor substrate; and wherein no insulating layer exists between the scintillator protective layer and the incident plane in each of the light-receiving elements.

8. A radiographic image capturing device comprising:

a sensor substrate having one surface on which a plurality of light-receiving elements are two-dimensionally arranged; and a scintillator substrate that is arranged on a side of the light-receiving elements of the sensor substrate, wherein a region having no interface between insulating layers that differ in refractive index is formed between the scintillator substrate and an incident plane in each of the light-receiving elements of the sensor substrate, wherein the scintillator substrate has a scintillator layer, a scintillator protective layer, and a scintillator adhesion layer, with the scintillator protective layer arranged between the scintillator layer and the scintillator adhesion layer, and the scintillator adhesion layer arranged between the scintillator protective layer and the sensor substrate; and wherein no insulating layer exists between the scintillator adhesion layer and the incident plane in each of the light-receiving elements.

* * * * *